United States Patent
Katsura et al.

(10) Patent No.: US 6,906,411 B1
(45) Date of Patent: Jun. 14, 2005

(54) MULTILAYER SUBSTRATE MODULE AND PORTABLE WIRELESS TERMINAL

(75) Inventors: Takatoshi Katsura, Hyogo (JP); Kenji Itoh, Hyogo (JP); Hiroaki Nagano, Hyogo (JP); Youji Isota, Hyogo (JP); Mitsuhiro Shimozawa, Hyogo (JP); Tadashi Takagi, Hyogo (JP); Noriharu Suematsu, Hyogo (JP); Masayoshi Ono, Hyogo (JP); Kenichi Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/048,500

(22) PCT Filed: Jun. 29, 2000

(86) PCT No.: PCT/JP00/04305

§ 371 (c)(1),
(2), (4) Date: Feb. 14, 2002

(87) PCT Pub. No.: WO02/01931

PCT Pub. Date: Jan. 3, 2002

(51) Int. Cl.⁷ ............................................ H01L 23/485

(52) U.S. Cl. ........................ 257/700; 257/664; 257/758; 257/773; 361/760; 361/761

(58) Field of Search .................................. 257/700, 664, 257/659, 758, 773, 723, 207, 760, 703, 920; 361/760, 761, 763, 764, 795, 762, 793, 750, 794, 810, 812, 719, 783, 780, 733; 330/66, 67; 343/845, 847; 455/283, 278.1, 288, 319

(56) References Cited

U.S. PATENT DOCUMENTS 6,353,540 B1 * 3/2002 Akiba et al. ................. 361/794

FOREIGN PATENT DOCUMENTS

| GB | 2325577 | 11/1998 | | |
|---|---|---|---|---|
| JP | 57-142857 | 9/1982 | | |
| JP | 61-7646 | 1/1986 | | |
| JP | 62-200789 | 9/1987 | | |
| JP | 63-100851 | 6/1988 | | |
| JP | 2-267997 | 11/1990 | | |
| JP | 3-43758 | 4/1991 | | |
| JP | 5-14015 | 1/1993 | | |
| JP | 5-67039 | 9/1993 | | |
| JP | 6-52170 | 7/1994 | | |
| JP | 7-22757 | 1/1995 | | |
| JP | 7-58240 | 3/1995 | | |
| JP | 9-283693 | 10/1997 | | |
| JP | 09283693 A | * | 10/1997 | ........... H01L/25/00 |
| JP | 10-224044 | 8/1998 | | |
| JP | 11-8445 | 1/1999 | | |
| JP | 11-54921 | 2/1999 | | |
| JP | 11-163219 | 6/1999 | | |

* cited by examiner

*Primary Examiner*—Tom Thomas
*Assistant Examiner*—Matthew C Landau
(74) *Attorney, Agent, or Firm*—Oblon, Spivak, McClelland, Maier & Neustadt, P.C.

(57) ABSTRACT

In a multi-layer substrate module receiving from an external earth node supply of a reference potential for grounding, a plurality of ground lines are provided respectively corresponding to a plurality of internal circuits. Moreover, a common node for coupling the ground lines is provided in an insulating layer of the multi-layer substrate module. The common node is electrically coupled to the earth node through a ground pin terminal shared by the plurality of internal circuits. Preferably, the common node is provided in the lowest insulating layer of the multi-layer substrate module. Thus, parasitic inductance of the portion through which an earth current flows, that is, the portion common to the plurality of internal circuits, can be suppressed with a small number of ground pin terminals. Accordingly, the inflow phenomenon of the earth current between the plurality of internal circuits is prevented, enabling stable operation.

2 Claims, 13 Drawing Sheets

MULTILAYER SUBSTRATE MODULE AND PORTABLE WIRELESS TERMINAL

TECHNICAL FIELD

The present invention relates to a multi-layer substrate module, and more particularly, relates to a multi-layer substrate module on which electronic circuits operating in a high frequency range are formed, and a wireless terminal device including circuits mounted on such a multi-layer substrate module.

BACKGROUND ART

In recent years, electronic equipments are increasingly reduced in size and weight. According to this trend, reduction in size, weight and thickness as well as compounding are increasingly realized for the circuit substrates for use in such electronic equipments. In particular, high-frequency wireless communication devices including mobile phones utilize a multi-layer substrate using ceramics, based on, e.g., the excellent dielectric characteristics of the ceramics and the multi-layer technology. Recently, such a multi-layer substrate is increasingly reduced in size and thickness.

An electronic circuit group forming the electronic equipments such as the aforementioned wireless communication devices is used as a multi-layer substrate module formed on a multi-layer substrate. In such a multi-layer substrate module, not only an integrated circuit group is mounted on the top surface of the substrate, but also circuit elements are actively formed in a layer within the substrate, thereby forming an electronic circuit group using these circuit elements. Therefore, this is particularly advantageous for reduction in size and weight.

FIG. 18 is a cross-sectional view of a multi-layer substrate module illustrating a common arrangement example of electronic circuits in such a multi-layer substrate module.

Referring to FIG. 18, the multi-layer substrate module 100 is mounted on a main board 10, and receives supply of a reference potential Vss for grounding from an earth node 20 provided on the main board 10. The multi-layer substrate module 100 is a lamination of a plurality of insulating layers 105 formed from ceramics or the like.

The multi-layer substrate module 100 includes electronic circuits 210, 220, 230 therein. Hereinafter, the electronic circuits formed in the multi-layer substrate module 100 are sometimes simply referred to as internal circuits. Circuit elements forming the internal circuits are arranged in the insulating layers 105 or on the top surface of the multi-layer substrate module. In general, passive elements such as coils and resistors are formed within the insulating layers, and semiconductor elements such as transistors and diodes are mounted on the surface of the multi-layer substrate module as integrated circuits.

FIG. 18 exemplarily shows the case where the multi-layer substrate module is formed from three internal circuits 210, 220, 230. The internal circuit 210 includes circuit elements 211 and 212 formed in the insulating layers 105. Similarly, the internal circuit 220 includes a circuit element 221 that is an integrated circuit mounted on the multi-layer substrate module, and circuit elements 222, 223 formed in the insulating layers 105. The internal circuit 230 includes circuit elements 231, 232 and 233 formed in the insulating layers 105.

Although not specifically shown in the figure, the multi-layer substrate module 100 includes, as appropriate, pattern wirings for connecting these circuit elements. Transmission of electric signals between the multi-layer substrate module 100 and the main board 10 is conducted through signal transmission nodes 202 provided as, e.g., pin terminals. At least one of the signal transmission nodes is connected to the earth node 20 on the main board 10 in order to ground the multi-layer substrate module 100. Hereinafter, these signal transmission nodes are sometimes simply referred to as pin terminals 202, and the signal transmission node connected to the earth node is sometimes referred to as ground pin terminal 204 in order to distinguish it from the pin terminals 202.

A main ground line 150 connected to the ground pin terminal 204 is formed within the multi-layer substrate module 100 so as to extend through the insulating layers 105 in the vertical direction. Sub ground lines 215, 225, 235 are provided between the respective internal circuits and the main ground line 150. The main ground line 150 and the sub ground lines 215, 225, 235 electrically couple the respective internal circuits to the earth node 20 provided on the main board on which the multi-layer substrate module 100 is mounted, so that the internal circuits can receive supply of the reference potential Vss for grounding. Hereinafter, the main ground line and the sub ground lines are sometimes collectively referred to as a ground line group.

However, if the internal circuits provided in the multi-layer substrate module are circuits utilizing a high frequency, their operation stability may be degraded due to parasitic inductance of the ground line group.

FIG. 19 is a conceptual diagram illustrating the problems that occur in the internal circuits due to the parasitic inductance of the ground line group. FIG. 19 exemplarily shows the problems that occur between the internal circuits 210 and 220.

Referring to FIG. 19, the internal circuit 210 is electrically coupled to the earth node 20 through the sub ground line 215 and the main ground line 150. Similarly, the internal circuit 220 is connected to the earth node 20 through the sub ground line 225 and the main ground line 150. Provided that parasitic inductance of the main ground line 150 is Lgrd, impedance due to the parasitic inductance Lgrd, $Z = \omega \cdot Lgrd$ (where $\omega = 2 \cdot \pi \cdot f$; f is a frequency of a current), increases with increase in frequency.

Accordingly, in high-frequency operation, an earth current Igrd that is supposed to flow from the internal circuit 210 into the earth node 20 may possibly flow into another internal circuit 220 (Igrd') through the sub ground line 225, rather than flowing through the main ground line 150 having high impedance.

Such an earth current Igrd flowing into another internal circuit as inflow current Igrd' may possibly destabilize the operation of that internal circuit 220. Hereinafter, such a phenomenon as shown in FIG. 19 is sometimes referred to as an inflow phenomenon of the earth current.

In particular, such a problem greatly affects an internal circuit provided in the upper layer portion of the multi-layer substrate module that is subjected to increased parasitic inductance of the main ground line 150.

An integrated circuit mounted on a multi-layer substrate module such as a semiconductor chip has also suffered from the same problem.

FIG. 20 is a cross-sectional view showing a common arrangement example of a plurality of electronic circuits formed on a multi-layer substrate module.

Referring to FIG. 20, internal circuits 230 and 240 are integrated circuits including, e.g., semiconductor elements.

In such an integrated circuit, a metal coating film for grounding is formed on its back surface, so that the integrated circuit is often grounded by the metal coating film.

For example, in the example of FIG. 22, the internal circuits 230 and 240, that is, integrated circuits, are respectively grounded by metal coating films 235 and 245.

In the case where the internal circuits 230 and 240 are integrally formed as a single chip on the multi-layer substrate module, the metal coating films 235 and 245 integrally serve as a single ground electrode. Accordingly, forming a sub ground line 255 between the integrated metal coating film 235, 245 and the main ground line 150 provided within the multi-layer substrate module 100 enables grounding of the internal circuits provided on the multi-layer substrate module.

However, the internal circuits 230 and 240 arranged as such may also be subjected to the inflow phenomenon of the earth current described in connection with FIG. 19 during high-frequency operation. This phenomenon is increased particularly for the internal circuits arranged on the multi-layer substrate module, due to the longer path length of the main ground line 150 and thus higher parasitic inductance Lgrd.

On the other hand, such a problem may also occur in a single internal circuit formed in the multi-layer substrate module. For example, a CDMA (Code Division Multiple Access)-based mobile phone uses a frequency band of about 1 to 2 GHz. However, components of such a mobile phone like a low noise amplifier (hereinafter, also referred to as a high-frequency amplifier circuit) and an orthogonal mixer may suffer from these problems.

FIG. 21 is a circuit diagram showing the structure of a common high-frequency amplifier circuit.

Referring to FIG. 21, the high-frequency amplifier circuit 300 includes a transistor 310 serving as an amplifying element, and resistive elements R1 to R4, capacitors C1 to C5 and an inductor L that are arranged around the transistor 310. These peripheral elements form a bias resistance, a coupling capacitance or the like for the transistor 310. A field effect transistor is exemplarily used as the transistor 310.

The high-frequency amplifier circuit 300 is driven by a driving potential Vdd, and amplifies a voltage signal applied to its input node IN for output to its output node OUT. Since the high-frequency amplifier circuit 300 is a commonly used circuit, detailed description of the operation thereof is omitted.

FIG. 22 is a conceptual diagram illustrating the problems that occur in the high-frequency amplifier circuit 300 due to the parasitic inductance of the ground lines.

Referring to FIG. 22, the peripheral elements (resistive elements, capacitors, and inductor) in FIG. 21 are shown as blocks 321 to 326. In the transistor 310, a current path is formed between the drain 312 and the source 313 according to an input to the gate 311. The potential level in response to the source-drain current appears at the output node OUT, whereby signal amplification is conducted.

In this case, the gate 311, drain 312 and source 313 of the transistor 310 are respectively connected to the main ground line 150 through the blocks 322, 324 and 325 as the peripheral elements so as to be grounded. In this case, as shown in FIG. 19, impedance due to the parasitic inductance Lgrd of the main ground line 150 is increased during high-frequency operation. Therefore, a drain current that is supposed to flow into the earth node 20 partially flows as an input to the gate 311 of the transistor 310. This phenomenon destabilizes the amplifying function of the transistor 310, whereby the high-frequency amplifier circuit 300 may possibly be rendered in an unstable state that is generally called "oscillation phenomenon".

FIG. 23 is a block diagram showing arrangement of the orthogonal mixer.

Referring to FIG. 23, a 90° distributor 402 distributes a high-frequency signal RF (frequency frf) as a high-frequency signal RFI for I channel and a high-frequency signal RFQ for Q channel that have a phase difference of 90° from each other. A 0° distributor 404 distributes a local oscillation signal LO (frequency flo) as signals that are in phase with each other.

The orthogonal mixer 400 includes a first mixer 410a for I channel and a second mixer 410b for Q channel. The orthogonal mixer 400 receives the high-frequency signal RFI for I channel and the high-frequency signal RFQ for Q channel, which have a phase difference of 90° from each other, and the local oscillation signal LO to produce base band signals BBI and BBQ. The high-frequency signal RF corresponds to, e.g., a receiving wave in the mobile phones. The frequency flo of the local oscillation signal LO is half the frequency frf of the high-frequency signal RF.

The first mixer 410a produces the base band signal BBI (frequency |frf−flo|) based on the high-frequency signal RFI for I channel and the local oscillation signal LO. Similarly, the second mixer 410b receives the high-frequency signal RFQ for Q channel and the local oscillation signal LO to produce the base band signal BBQ (frequency |frf−flo|).

FIG. 24 is a waveform chart illustrating an ideal output signal of the orthogonal mixer.

Referring to FIG. 24, in an ideal state, the first mixer 410a and the second mixer 410b operate in a symmetric manner to produce the base band signals BBI and BBQ having the same amplitude and also having a phase difference of 90° from each other.

FIG. 25 is a conceptual diagram illustrating the problems that occur in the orthogonal mixer 400 due to the parasitic inductance of the ground lines.

It is now assumed that the orthogonal mixer 400 is formed within the multi-layer substrate module. In this case, when the first mixer 410a and the second mixer 410b are connected to the main ground line 150, the adverse effect resulting from the inflow of the earth current as described before is not caused by another internal circuit, but occurs between the first mixer 410a and the second mixer 410b in the orthogonal mixer circuit.

More specifically, as shown in FIG. 25, the earth current Igrd that is supposed to flow from, e.g., the first mixer 410a to the earth node 20 flows into the second mixer 410b through a current path shown by a dashed line due to the parasitic inductance Lgrd of the main ground line 150. This may possibly degrade orthogonality of both mixers. Due to the adverse effect of the inflow current Igrd', an amplitude variation ΔA and a phase variation Δφ are produced between the base band signals BBI and BBQ, as shown in FIG. 26, resulting degraded orthogonal accuracy of the orthogonal mixer.

DISCLOSURE OF THE INVENTION

It is an object of the present invention to provide a multi-layer substrate module having ground-line arrangement for a plurality of electronic circuits mounted thereon, which is capable of preventing operation from being destabilized during high-frequency operation.

It is another object of the present invention to provide a wireless terminal device including an orthogonal mixer mounted on a multi-layer substrate module, and capable of ensuring sufficient orthogonal accuracy even during high-frequency operation.

According to the present invention, a multi-layer substrate module receiving supply of a reference potential from an external potential node includes a plurality of insulating layers laminated each other, at least one reference potential transmission node, a plurality of internal circuits and a plurality of reference potential lines. The reference potential transmission node is electrically coupled to the external potential node. The plurality of internal circuits each includes at least one circuit element formed either in the corresponding insulating layer or on a surface of the multi-layer substrate module. The plurality of reference potential lines are provided respectively corresponding to the plurality of internal circuits, for transmitting the reference potential.

Preferably, the reference potential transmission nodes are provided respectively corresponding to the plurality of internal circuits, and one of the plurality of reference potential lines has smaller parasitic inductance than that of each of the remainder of the plurality of reference potential lines.

Preferably, the reference potential transmission node is provided as a node common to the plurality of internal circuits. The multi-layer substrate module further includes a common wiring node provided in one of the plurality of insulating layers and electrically coupled to the reference potential transmission node, and each of the reference potential lines is electrically coupled to the common wiring node in the insulating layer in which the common wiring node is provided.

Preferably, the multi-layer substrate module is mounted on a main board. The multi-layer substrate module further includes a plurality of signal transmission nodes for receiving and outputting an electric signal to and from the main board, and a metal coating film formed so as to cover an outer surface of the multi-layer substrate module, and electrically coupled to the external potential node. Each of the reference potential lines is electrically coupled to the metal coating film, and the metal coating film is formed without contacting the plurality of signal transmission nodes.

Preferably, one of the plurality of internal circuits is a first integrated circuit that is mounted on a top surface of the multi-layer substrate module, another one of the plurality of internal circuits is a second integrated circuit that is mounted on the top surface of the multi-layer substrate module, the first and second integrated circuits are mounted on the same chip having a common metal electrode, and reference potential lines corresponding to the first and second integrated circuits are directly provided between the first and second integrated circuits and the external potential node, respectively.

In such a multi-layer substrate module, an earth current can be reliably guided to the earth node even during high frequency operation, whereby operation of the internal circuits can be prevented from being destabilized.

According to another aspect of the present invention, a wireless terminal device for selectively receiving a desired channel out of a plurality of channels includes an antenna, a local oscillator, a phase shifter, a first mixer circuit, a second mixer circuit, and a base band circuit. The antenna receives a high frequency signal including the plurality of channels. The local oscillator oscillates a local oscillation signal. The phase shifter produces first and second high frequency signals having a phase difference of 90° from each other in response to the high-frequency signal from the antenna. The first mixer circuit mixes the first high frequency signal from the phase shifter with the local oscillation signal from the local oscillator to produce a first base band signal. The second mixer circuit mixes the second high frequency signal from the phase shifter with the local oscillation signal from the local oscillator to produce a second base band signal. The base band circuit demodulates the first and second base band signals. The first and second mixer circuits are mounted on a multi-layer substrate module that receives supply of a reference potential from an external potential node. The multi-layer substrate module includes a plurality of insulating layers laminated to each other, at least one reference potential transmission node electrically coupled to the external potential node, and first and second reference potential lines provided respectively corresponding to the first and second mixer circuits, for transmitting the reference potential.

Preferably, the wireless terminal device farther includes an amplifier circuit provided between the antenna and the phase shifter, for amplifying the high frequency signal from the antenna. The amplifier circuit is mounted on the multi-layer substrate module, and the amplifier circuit includes a transistor for signal amplification. The transistor includes a control node receiving the high frequency signal as an input, a first conductive node receiving supply of a driving potential and producing an output signal to the phase shift circuit, and a second conductive node forming a current path between the second conductive node and the first conductive node according to the input to the control node. The multi-layer substrate module further includes a first sub reference potential line provided between the first control node and the external potential node, and a second sub reference potential line provided between the second conductive node and the external potential node independently of the first sub reference potential line.

In such a wireless terminal device, an orthogonal mixer is mounted on a multi-layer substrate module that is advantageous in terms of reduced size, and orthogonal accuracy of the orthogonal mixer can be ensured even during high frequency operation.

BEST MODE FOR CARRYING OUT THE INVENTION

Figure 1:
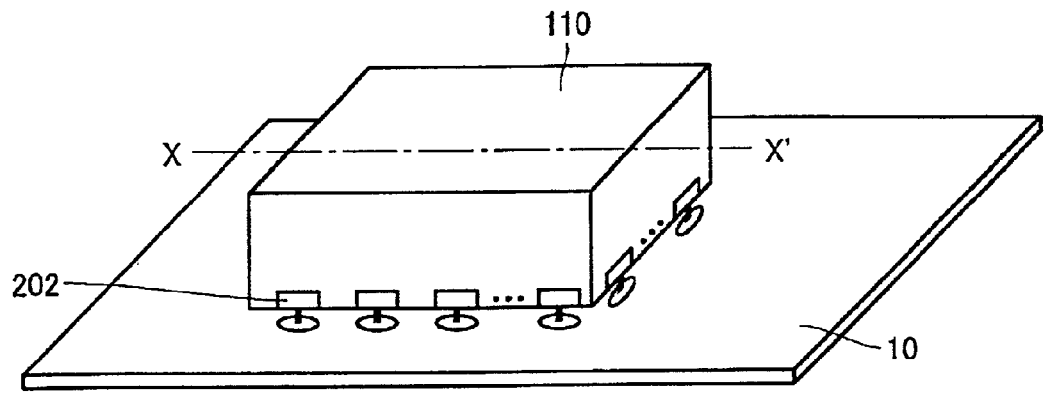
FIG. 1 is a schematic diagram showing the external appearance of a multi-layer substrate module according to a first embodiment of the present invention.

Hereinafter, a multi-layer substrate module according to embodiments of the present invention will be described in detail in conjunction with the accompanying drawings. Note that the same or corresponding portions are denoted with the same reference numerals and characters throughout the figures, and description thereof will not be repeated.

(First Embodiment)

Referring to FIG. 1, a multi-layer module 110 according to the first embodiment of the present invention is mounted on a main board 10. Although not specifically shown in the figure, a plurality of wiring patterns are formed on the main board 10, and electrically coupling the wiring patterns to signal transmission nodes 202 provided as, e.g., pin terminals allows for transmission of electric signals between the main board 10 and the internal circuits formed within the multi-layer substrate module 110.

Figure 2:
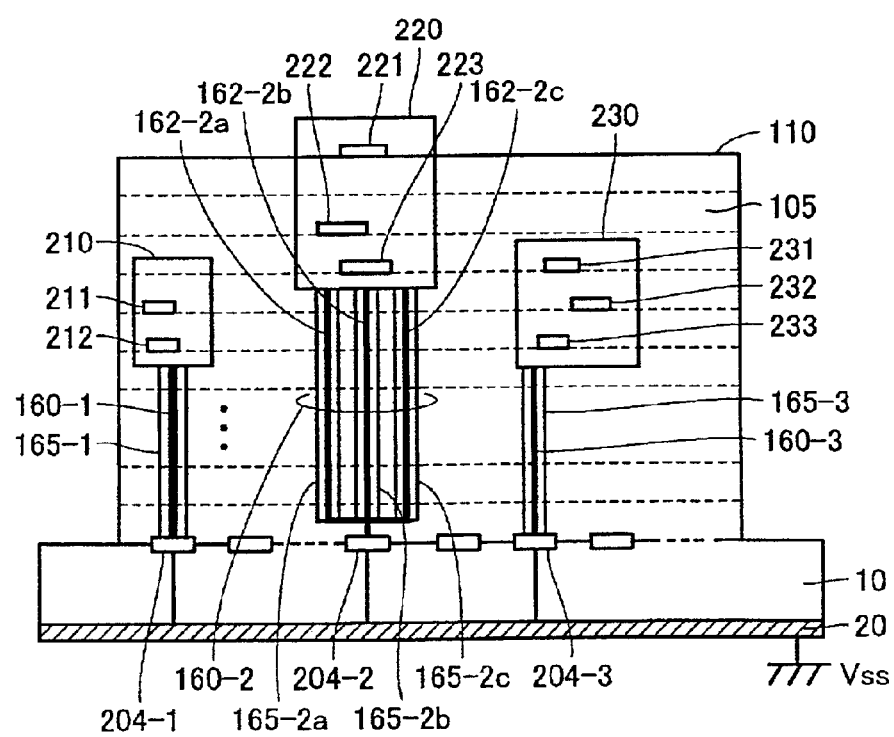
FIG. 2 is a cross-sectional view of the multi-layer substrate module taken along the line X–X' in FIG. 1.

Referring to FIG. 2, the multi-layer substrate module 110 receives supply of a reference voltage Vss by connecting to an earth node 20 provided on the main board 10. Hereinafter, such supply of the reference potential Vss is sometimes simply referred to as "grounding". For example, the wiring pattern of the earth node 20 is formed on the back surface of the main board 10, and used also for grounding the multi-layer substrate module 110.

At least one of the signal transmission nodes is electrically coupled to the earth node 20 in order to ground the multi-layer substrate module 110. Hereinafter, these signal transmission nodes are sometimes simply referred to as pin terminals 202, and the signal transmission node coupled to the earth node 20 is sometimes referred to as ground pin terminal 204 in order to distinguish it from the pin terminals 202.

Figure 18:
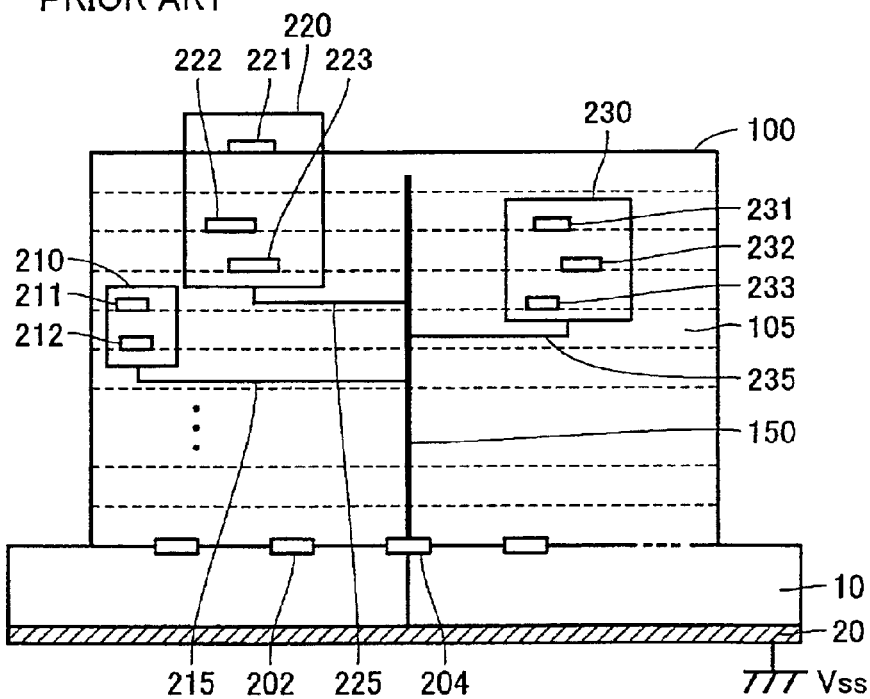
FIG. 18 is a cross-sectional view of a multi-layer substrate module illustrating a common arrangement example of electronic circuits in such a multi-layer substrate module.
Figure 19:
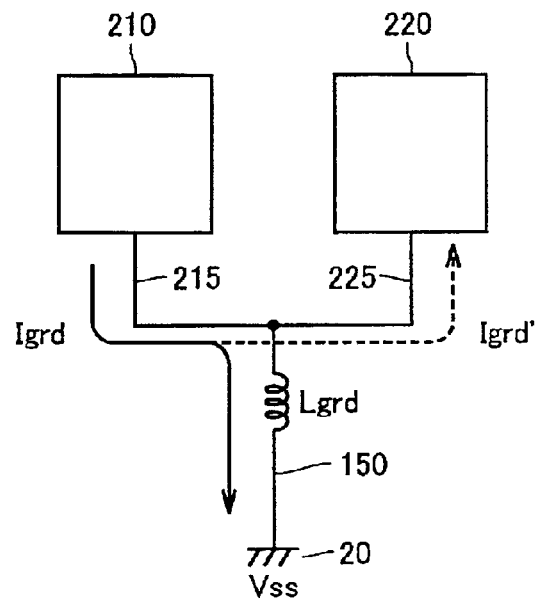
FIG. 19 is a conceptual diagram illustrating the problems that occur in the internal circuits due to parasitic inductance of the ground lines.

The multi-layer substrate module 110 further includes a plurality of ground lines 160-1, 160-2 and 160-3 respectively corresponding to a plurality of internal circuits 210, 220 and 230. Since a circuit element group forming each internal circuit is the same as that described in connection with FIG. 18, description thereof will not be repeated. Although three internal circuits are herein provided in the multi-layer substrate module, this is by way of example only, and the structure of the present invention is applicable to the case where any plurality of internal circuits are provided.

The ground lines 160-1, 160-2, 160-3 are respectively connected to a plurality of independent ground pin terminals 204-1, 204-2, 204-3. The ground pin terminals 204-1, 204-2, 204-3 are electrically coupled to the earth node 20.

Each ground line is formed in a via hole extending through insulating layers 105.

The ground line 160-1 is provided in a via hole 165-1 formed between the ground pin terminal 204-1 and the internal circuit 210. Similarly, the ground line 160-3 is provided in a via hole 165-3 formed between the ground pin terminal 204-1 and the internal circuit 230.

The ground line 160-2 is formed from a plurality of ground lines 162-2a, 162-2b and 162-2c connected in parallel with each other. The plurality of ground lines 162-2a, 162-2b and 162-2c are respectively provided in a plurality of via holes 165-2a, 165-2b and 165-2c formed in parallel between the ground pin terminal 204-2 and the internal circuit 220.

Thus, providing a ground line for each internal circuit in the multi-layer substrate module can prevent the circuit operation from being destabilized by the inflow phenomenon of the earth current between the internal circuits.

Moreover, by forming the via hole 160-1 having a larger cross-sectional area than that of the other via holes so as to increase the cross-sectional area of the ground line 160-1, a parasitic inductance value of the ground line 160-1 can be suppressed. A parasitic inductance value of the ground line 160-2 can also be suppressed since the ground line 160-2 is formed from a plurality of ground lines connected in parallel.

Thus, by increasing as required the cross-sectional area of a via hole in which a ground line is formed, and parallel-connecting the wirings formed in a plurality of via holes, parasitic inductance of the ground line corresponding to an internal circuit for which grounding is to be particularly reinforced can be suppressed. This prevents the inflow phenomenon of the earth current from occurring between the internal circuits during high-frequency operation in a more reliable manner, enabling stable operation of the internal circuits.

(Second Embodiment)

Figure 3:
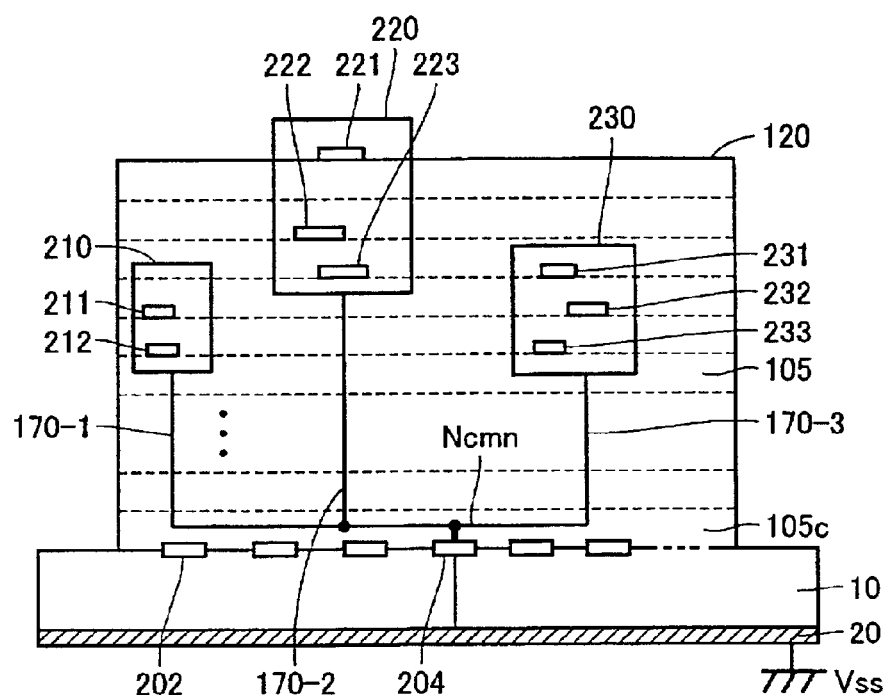
FIG. 3 is a cross-sectional view of a multi-layer substrate module according to a second embodiment of the present invention.

Referring to FIG. 3, a multi-layer substrate module 120 according to the second embodiment of the present invention includes a plurality of internal circuits 210, 220, 230 as in the case of the multi-layer substrate module 110 according to the first embodiment of the present invention. Since the structure and the number of internal circuits are the same as those described in the first embodiment, description thereof will not be repeated.

In the first embodiment of the present invention, ground pin terminals are respectively provided for a plurality of internal circuits. Accordingly, the ground pin terminals corresponding to the number of internal circuits are required, resulting in an increased number of pins. Therefore, in the multi-layer substrate module 120, a common node Ncmn for integrating the ground lines provided for the respective internal circuits is formed in the insulating layer 105C, so that only the common node is coupled to the ground pin terminal 204.

A plurality of ground lines 170-1, 170-2, 170-3 respectively corresponding to the plurality of internal circuits 210, 220 and 230 are coupled to each other in the insulating layer 105C having the common node Ncmn. The common node Ncmn is electrically coupled to the earth node 20 through the ground pin terminal 204 shared by the plurality of internal circuits.

In particular, by providing the common node Ncmn in a lower insulating layer in the multi-layer substrate module 120, preferably in the lowest insulating layer, parasitic inductance between the common node Ncmn and the earth node 20, that is, parasitic inductance of the portion through which the earth current flows, the portion common to the plurality of internal circuits 210, 220, 230, can be suppressed with a small number of ground pin terminals.

Such a structure enables the inflow phenomenon of the earth current between the internal circuits to be suppressed with a small number of ground pin terminals, allowing stable operation of the internal circuits.

(Third Embodiment)

Figure 4:
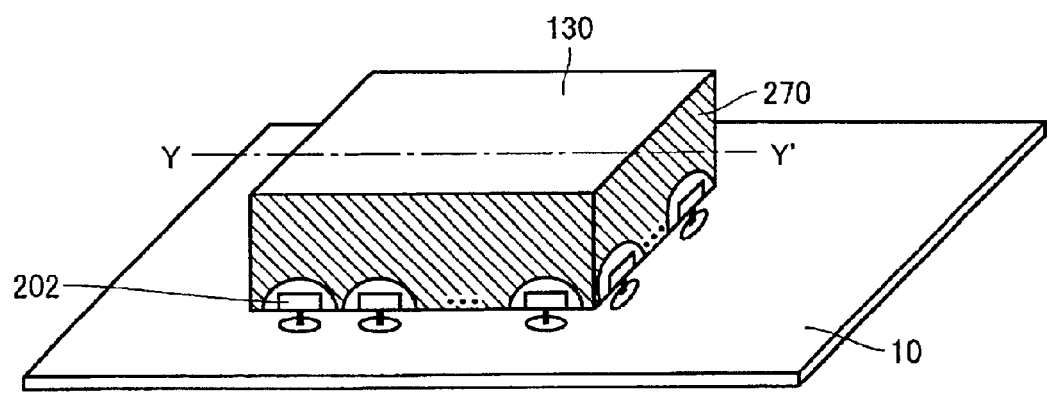
FIG. 4 is a schematic diagram showing the external appearance of a multi-layer substrate module according to a third embodiment of the present invention.

Referring to FIG. 4, a multi-layer substrate module 130 according to the third embodiment of the present invention is different from the multi-layer substrate module 110 of the first embodiment shown in FIG. 1 in that the multi-layer substrate module 130 includes a metal coating film 270 formed on its outer surface (side surface) so as to be connected to the earth node 20. The metal coating film 270 is electrically coupled to the earth node 20, and serves as a ground electrode. The metal coating film 270 is not formed in the regions around the pin terminals 202 other than the earth terminal 204 so that the pin terminals 202 do not contact the metal coating film 270.

Figure 5:
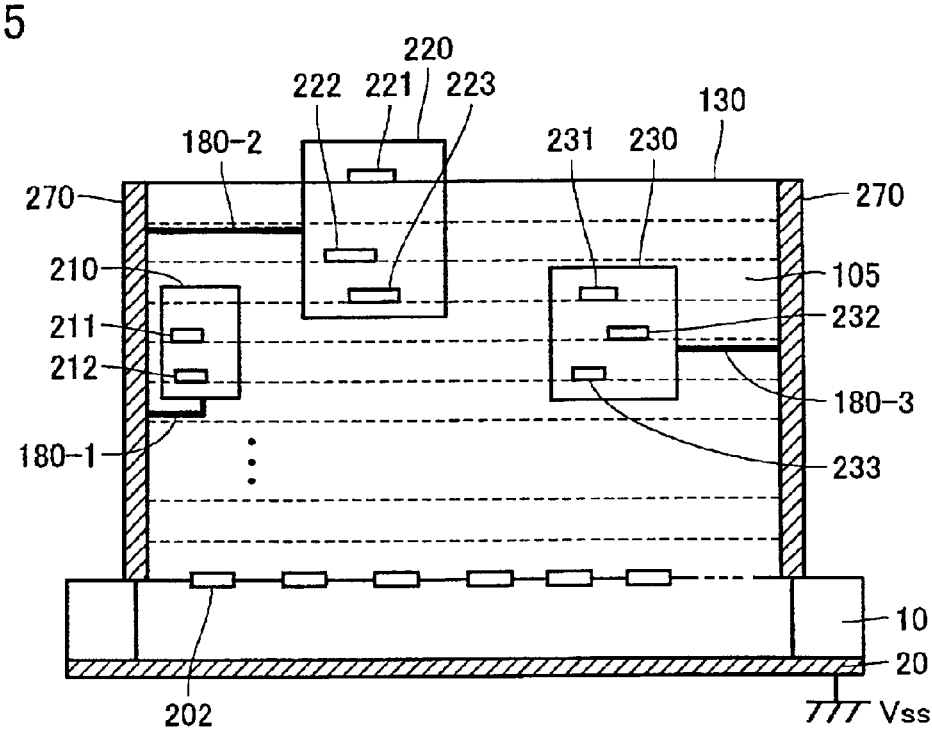
FIG. 5 is a cross-sectional view of the multi-layer substrate module taken along the line Y–Y' in FIG. 4.

Referring to FIG. 5, the multi-layer substrate module 130 according to the third embodiment of the present invention includes a plurality of internal circuits 210, 220, 230 as in the case of the multi-layer substrate module 110 according to the first embodiment of the present invention. Since the structure and the number of internal circuits are the same as those described in the first embodiment, description thereof will not be repeated.

Ground lines 180-1, 180-2 and 180-3 respectively corresponding to the internal circuits 210, 220 and 230 are electrically coupled to the metal coating film 270 serving as a ground electrode. This enables the internal circuits to be respectively grounded through ground lines extending in the horizontal direction rather than through the via holes extending through the insulating layers in the vertical direction. Therefore, parasitic inductance of each ground line can be suppressed.

Moreover, since the pin terminals 202 do not contact the metal coating film 270 for grounding, grounding of the internal circuits can be reinforced while ensuring the pin terminals for inputting/outputting an electric signal.

(Fourth Embodiment)

In the fourth embodiment, how a low noise amplifier and an orthogonal mixer provided in a mobile phone, one of the wireless terminal devices for which accurate high-frequency operation is particularly required, is mounted in a multi-layer substrate module will be described.

Figure 6:
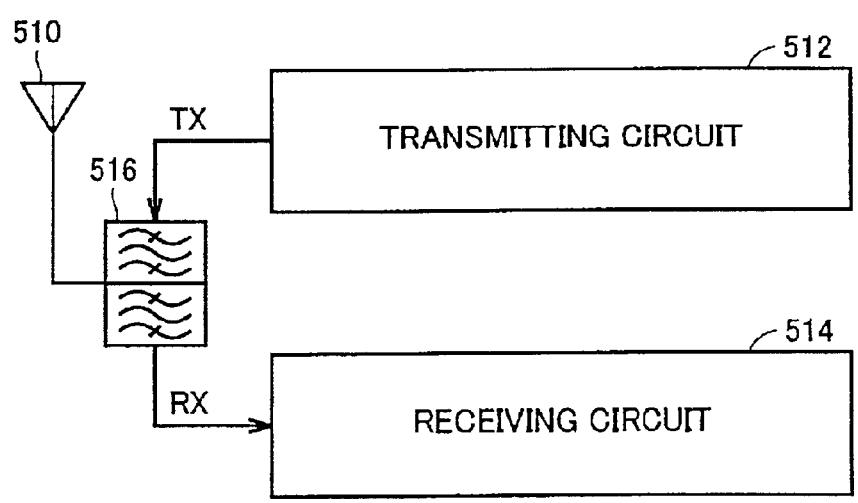
FIG. 6 is a block diagram showing the overall structure of a mobile phone including a multi-layer substrate module according to a fourth embodiment of the present invention.

Referring to FIG. 6, a mobile phone 500 including a multi-layer substrate module according to the fourth embodiment of the present invention includes an antenna 510, a transmitting circuit 512, a receiving circuit 514, and a transmission/reception branching filter 516.

This mobile phone is based on the CDMA, and conducting transmission and reception simultaneously via a single antenna 510. Accordingly, a transmission frequency is set to a different value from a reception frequency. The transmission frequency is herein set to a value lower than the reception frequency. Therefore, the transmission/reception branching filter 516 is formed from a band pass filter for passing only a transmitting wave TX therethrough and a band pass filter for passing only a receiving wave RX therethrough, so that the transmitting wave TX hardly reaches the receiving circuit 514.

Figure 7:
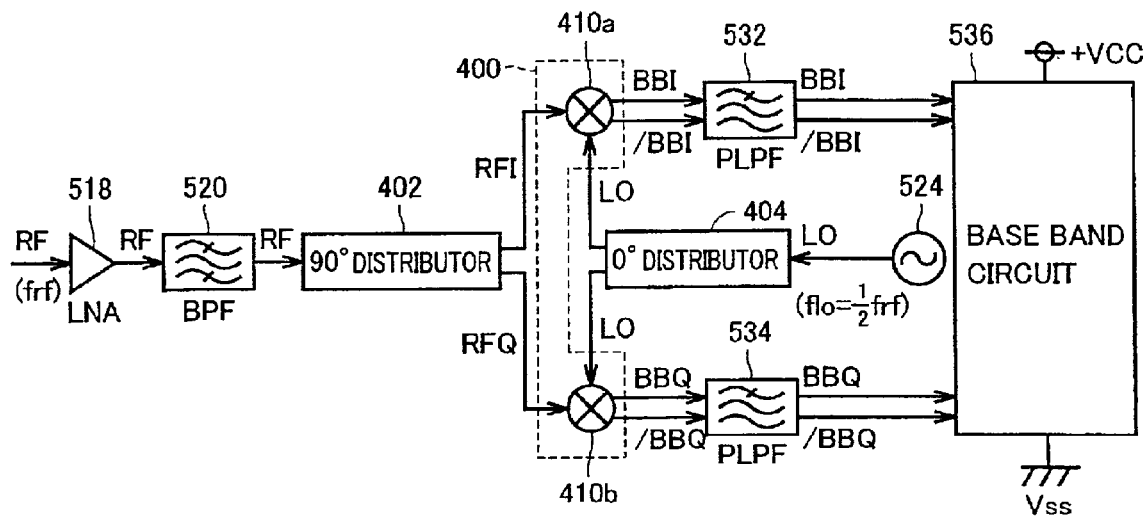
FIG. 7 is a block diagram specifically showing the structure of a receiving circuit in FIG. 6.

Referring to FIG. 7, the receiving circuit 514 includes a low noise amplifier (LNA) 518, a band pass filter (BPF) 520, a 90° distributor 402, a local oscillator 524, an in-phase (0°) distributor 404, an orthogonal mixer 400, low pass filters 532, 534, and a base band circuit 536.

The low noise amplifier 518 amplifies the receiving wave RX (hereinafter, sometimes referred to as high frequency signal RF) passing through the transmission/reception branching filter 516 at a high SN (Signal to Noise) ratio. The band pass filter 520 removes an unwanted signal and passes only a required high frequency signal RF. The 90° distributor 402 produces a high frequency signal RFI for I channel and a high frequency signal RFQ for Q channel that have a phase difference of 90° from each other, based on the high frequency signal RF passing through the band pass filter 520.

The local oscillator 524 oscillates a local oscillation signal LO. The frequency flo of the local oscillation signal LO is half the frequency frf of the high frequency signal RF. The 0° distributor 404 distributes the local oscillation signal LO from the local oscillator 524 to a first mixer 410a and a second mixer 410b of the orthogonal mixer 400. The local oscillation signals LO applied to the first mixer 410a and the second mixer 410b are in phase with each other.

The first mixer 410a for I channel mixes the high frequency signal RFI from the 90° distributor 402 with the local oscillation signal LO from the 0° distributor 404 to produce I-channel base band signals BBI and /BBI. The first mixer 410a is of a differential type (balanced type), so that the base band signal /BBI has a phase difference of 180° from the base band signal BBI.

Similarly, the second mixer 410*b* for Q channel mixes the high frequency signal RFQ from the 90° distributor 402 with the local oscillation signal LO from the 0° distributor 404 to produce Q-channel base band signals BBQ and /BBQ. The second mixer is also of a differential type (balanced type), so that the base band signal /BBQ has a phase difference of 180° from the base band signal BBQ. Thus, the first mixer 410*a* and the second mixer 410*b* can together form the orthogonal mixer 400.

The base band circuit 536 receives the I-channel base band signals BBI, /BBI and the Q-channel base band signals BBQ, /BBQ passing through the low pass filters 532, 534 for demodulation into a low-frequency (audio) signal.

Figure 8:
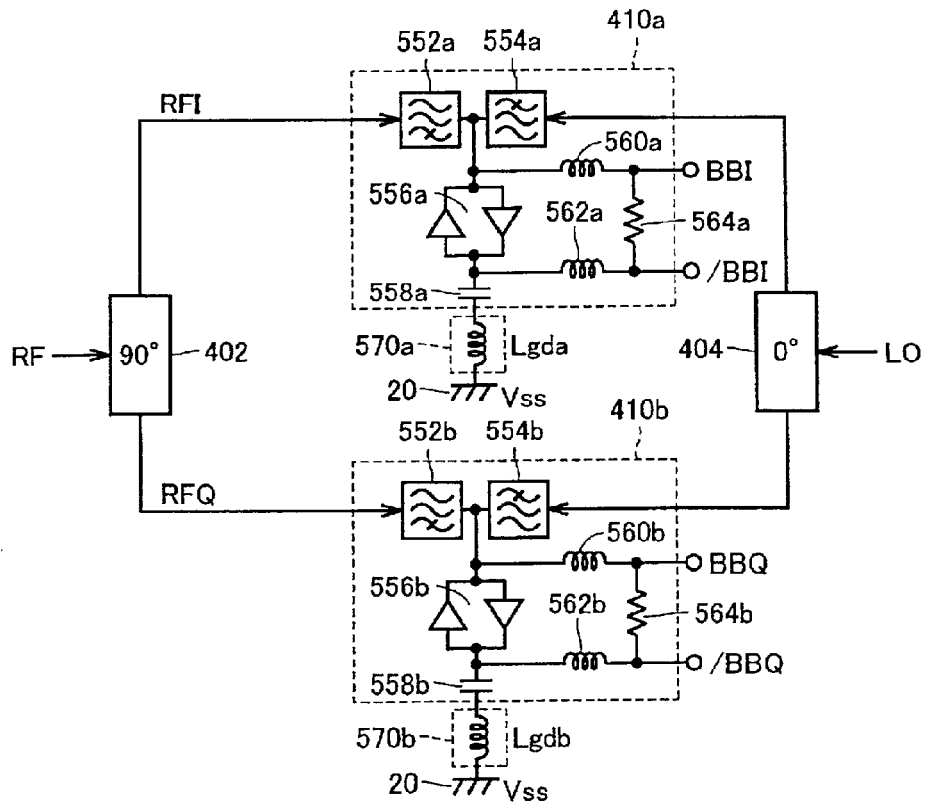
FIG. 8 is a circuit diagram showing the structure of an orthogonal mixer in FIG. 7.

Referring to FIG. 8, the first mixer 410*a* includes a high pass filter 552*a* for passing the high frequency signal RFI therethrough, a low pass filter 554*a* for passing the local oscillation signal LO therethrough, a diode pair 556*a* for mixing the high frequency signal RFI with the local oscillation signal LO, and a capacitor 558*a* connected between the diode pair 556*a* and the earth node 20. The first mixer 410*a* further includes inductors 560*a*, 562*a* and a resistive element 564*a*, which form a low pass filter for passing therethrough the I-channel base band signals BBI, /BBI output to both ends of the diode pair 556*a*.

The first mixer 410*a* is grounded to the earth node 20 through a ground line 570*a*. Parasitic inductance of the ground line 570*a* is herein denoted with Lgda.

The second mixer 410*b* has the same structure as that of the first mixer 410*a*, and includes a high pass filter 552*b*, a low pass filter 554*b*, a diode pair 556*b*, a capacitor 558*b*, inductors 560*b*, 562*b*, and a resistive element 564*b*. A ground line 570*b* is provided for the second mixer 410*b*, so that the second mixer 410*b* is electrically coupled to the earth node 20 for grounding. Parasitic inductance of the ground line 570*b* is denoted with Lgdb.

In order to ensure orthogonal accuracy between the first mixer 410*a* and the second mixer 410*b*, each mixer thus has the same circuit structure.

Note that FIG. 8 shows the structure of an even harmonic mixer by way of example only. The phenomena caused by the parasitic inductance as described above occur also in a common mixer. Accordingly, the structure of the present invention is applicable not only to the even harmonic mixer but also to a common mixer.

Figure 9:
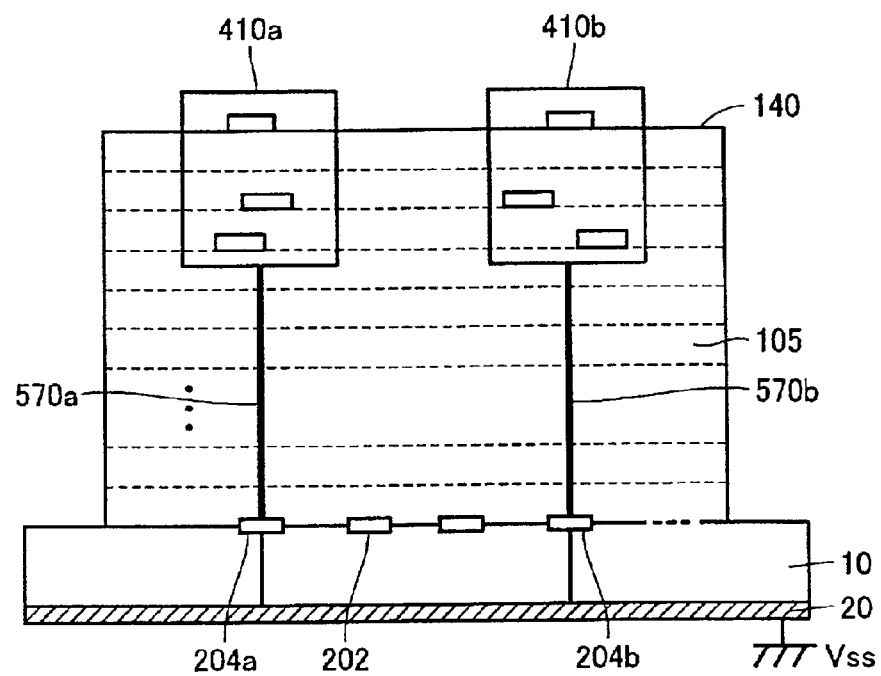
FIG. 9 is a cross-sectional view showing an arrangement example of ground lines in the multi-layer substrate module according to the fourth embodiment of the present invention.

Referring to FIG. 9, the first mixer 410*a* and the second mixer 410*b* are formed in a multi-layer substrate module 140 according to the embodiment of the present invention. The constituent elements 552*a* to 564*a* and 552*b* to 564*b* of the first mixer 410*a* and the second mixer 410*b* as described in connection with FIG. 8 are each formed on the top surface of the multi-layer substrate module 140 or within the insulating layers 105.

The ground lines 570*a* and 570*b* are separated from each other, and the ground lines 570*a* and 570*b* are electrically coupled to independent ground pin terminals 204*a* and 204*b*, respectively. By separating the ground lines respectively corresponding to the first mixer 510*a* and the second mixer 410*a* from each other, the inflow phenomenon of the earth current between the mixers and thus degradation in orthogonal accuracy can be prevented.

Figure 10:
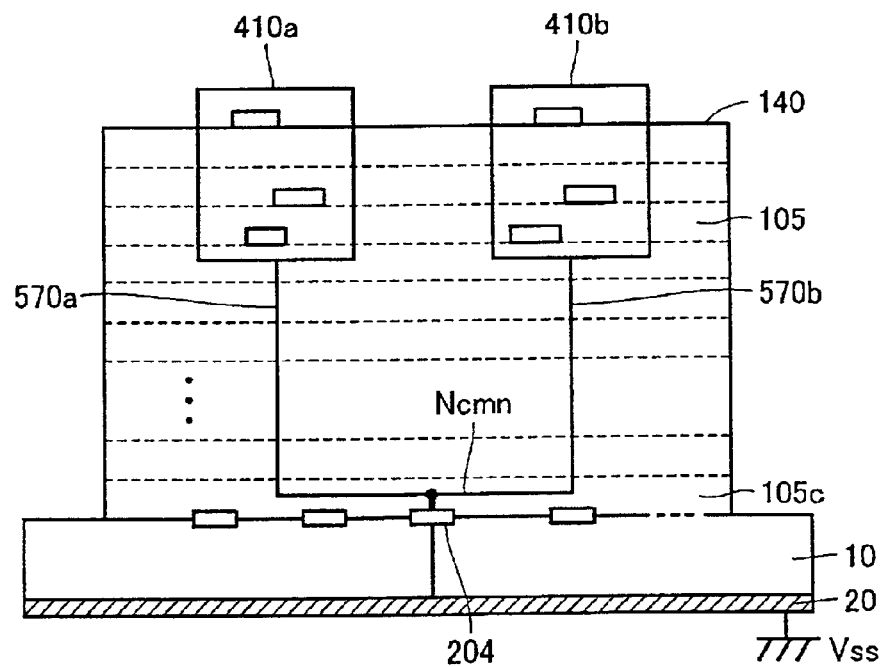
FIG. 10 is a cross-sectional view showing another arrangement example of ground lines in the multi-layer substrate module according to the fourth embodiment of the present invention.

Referring to FIG. 10, the first mixer 410*a* and the second mixer 410*b* may be grounded through a common node Ncmn according to the structure of the second embodiment. In this case, like FIG. 3, the common node Ncmn is provided for coupling the ground lines 570*a* and 570*b* in any one of the plurality of insulating layers, i.e., 105C. The common node Ncmn is connected to the earth node 20 through a ground pin terminal 204.

Thus, the portion of the ground line that is shared by the first mixer 410*a* and the second mixer 410*b* is limited to the portion from the common node Ncmn to the earth node 20, enabling sufficient suppression of the parasitic inductance of this portion. Moreover, providing the common connection mode Ncmn in the lowest insulating layer enables suppression of the parasitic inductance. This can prevent degradation in orthogonal accuracy due to the inflow of the earth current.

Figure 11:
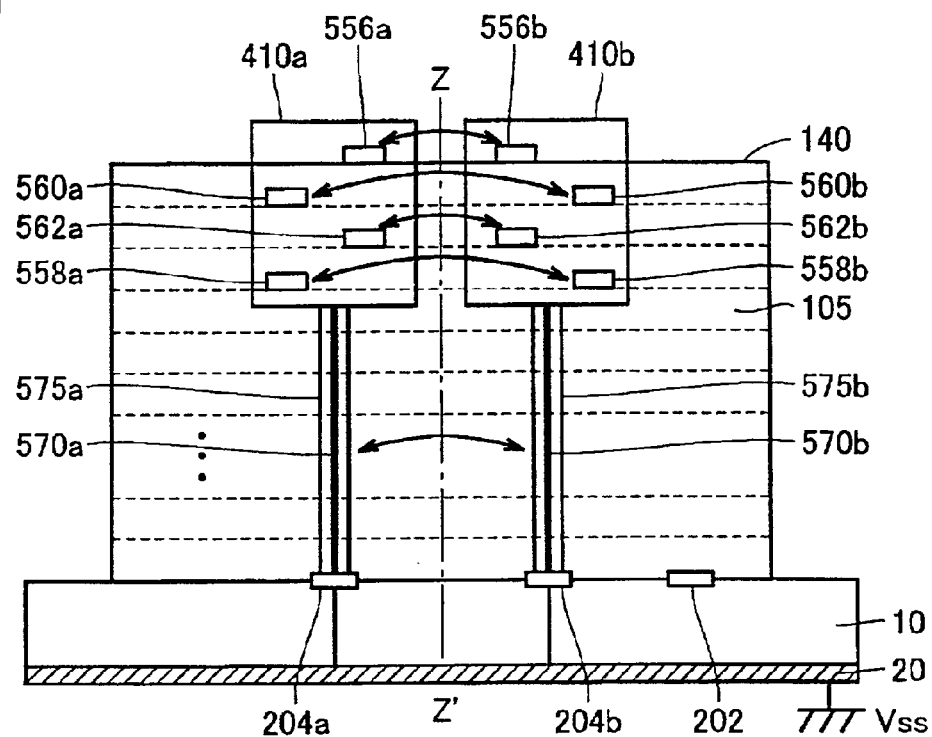
FIG. 11 is a cross-sectional view showing a vertical arrangement example of an orthogonal mixer formed in the multi-layer substrate module according to the fourth embodiment of the present invention.

Referring to FIG. 11, symmetrically arranging the first mixer 410*a* and the second mixer 410*b* in the multi-layer substrate module 140 enables further improved orthogonal accuracy between the mixers. In other words, as described in connection with FIG. 8, the first mixer 410*a* and the second mixer 410*b* have the same circuit structure. Therefore, the circuit elements of the first mixer 410*a* correspond to the circuit elements of the second mixer 410*b*.

Accordingly, symmetrically arranging the respective corresponding circuit elements within the multi-layer substrate module 140 enables further improved orthogonal accuracy between the first mixer 410*a* and the second mixer 410*b*. More specifically, as shown in FIG. 11, the corresponding components of the respective mixers are formed in the same insulating layer 105. FIG. 11 exemplarily shows the arrangement of some of the circuit elements of the mixer.

As shown in FIG. 11, the ground lines 570*a* and 570*b* are also provided in contact holes 575*a* and 575*b* extending through the same insulating layers. Moreover, provided that the ground lines 570*a* and 570*b* have the same shape and cross-sectional area, the parasitic inductances Lgda and Lgdb have the same value, enabling improved orthogonal accuracy of the first mixer 410*a* and the second mixer 410*b*.

Figure 12:
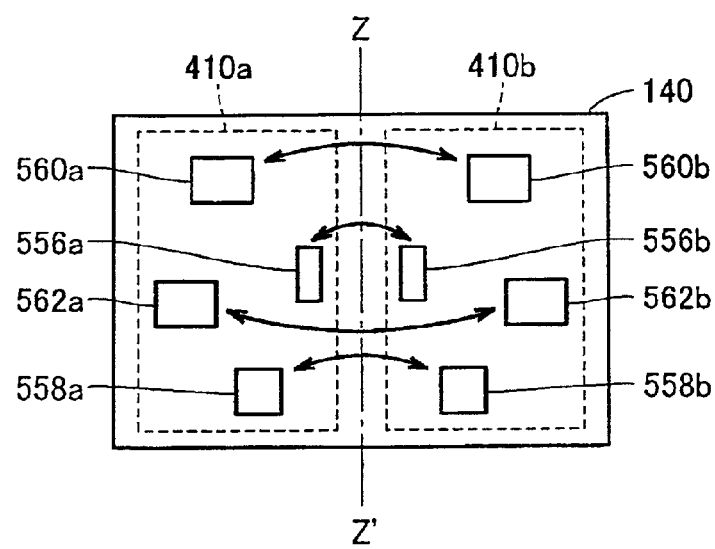
FIG. 12 is a top view showing a horizontal arrangement example of the orthogonal mixer formed in the multi-layer substrate module according to the fourth embodiment of the present invention.

As shown in FIG. 12, symmetrically arranging the respective components also in the horizontal direction with respect to the symmetric axis Z–Z' enables further improved orthogonal accuracy of the first mixer 410*a* and the second mixer 410*b*.

Figure 13:
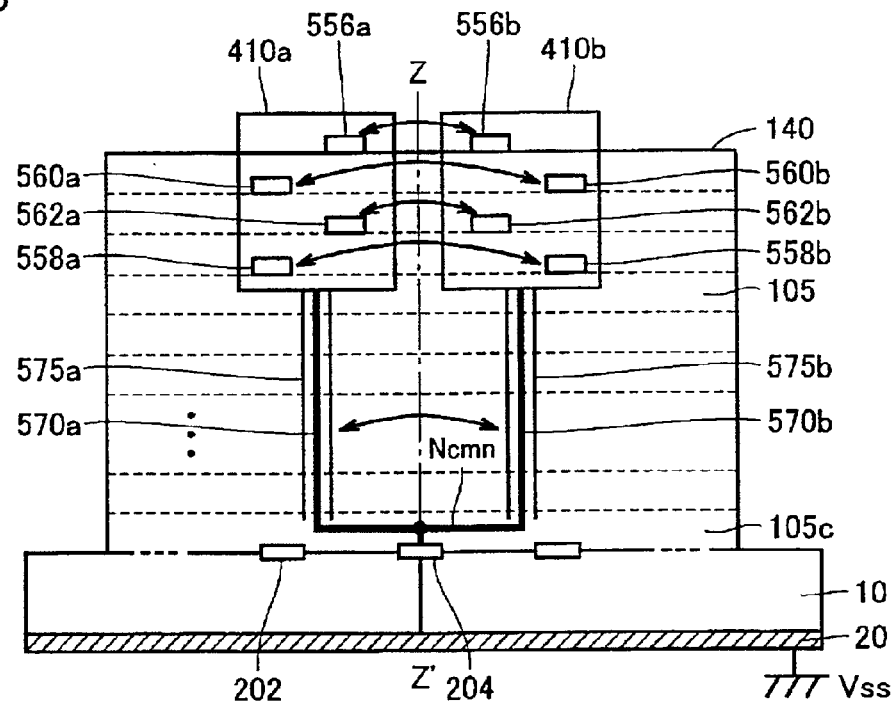
FIG. 13 is a cross-sectional view showing another vertical arrangement example of the orthogonal mixer formed in the multi-layer substrate module according to the fourth embodiment of the present invention.

As shown in FIG. 13, such symmetric arrangement of the constituent elements of the first mixer and the second mixer as well as the ground lines is also applicable to the case where grounding is realized with the common node Ncmn as shown in FIG. 10. In this case as well, the via holes 575*a* and 575*b* having the same shape is formed so as to extend between the first mixer 410*a* and the second mixer 410*b* and the insulating layer 105C in which the common node Ncmn is formed, and the ground lines 570*a* and 570*b* having the same shape and cross-sectional area are provided within the respective via holes. Thus, the parasitic inductances Lgda and Lgdb of the ground lines of the respective mixers have the same value, allowing for improvement in orthogonal accuracy.

Hereinafter, how the low-noise amplifier 518 is mounted on the multi-layer substrate module will be described.

Figure 14:
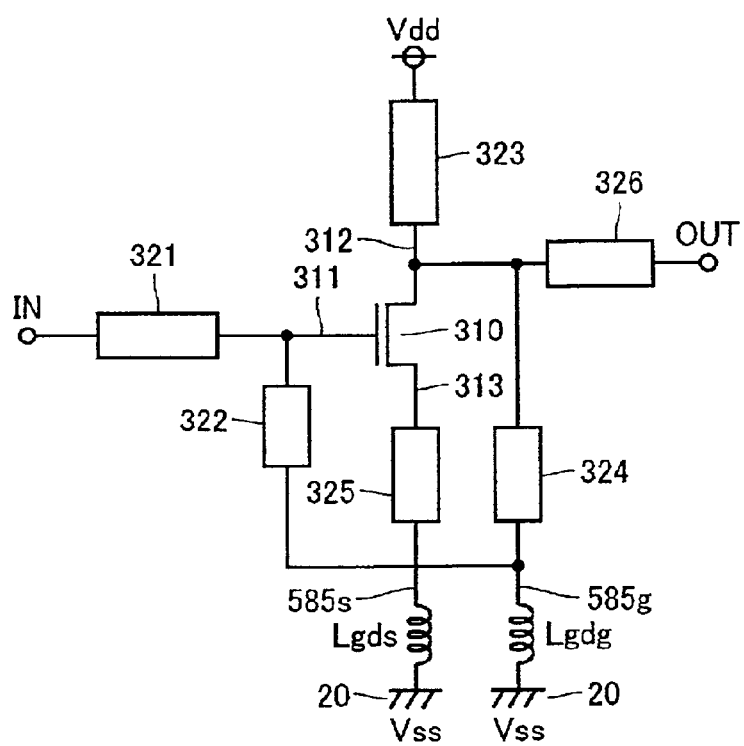
FIG. 14 is a circuit diagram of a low noise amplifier in FIG. 7.
Figure 21:
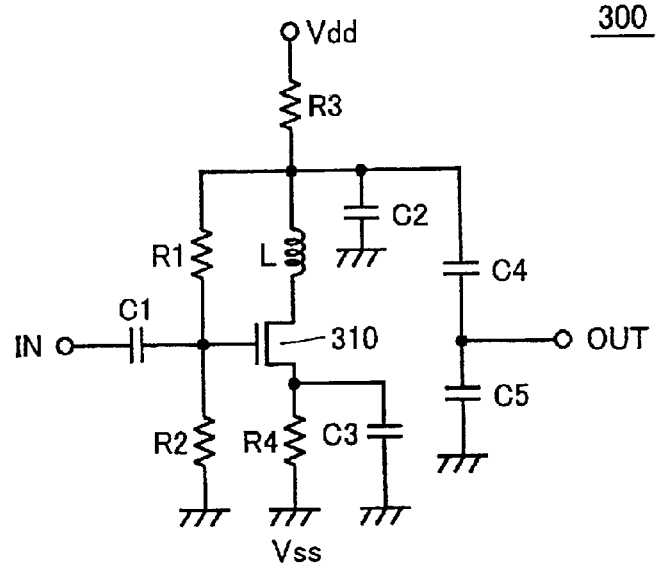
FIG. 21 is a circuit diagram showing an example of the structure of a common high-frequency amplifier circuit.
Figure 22:
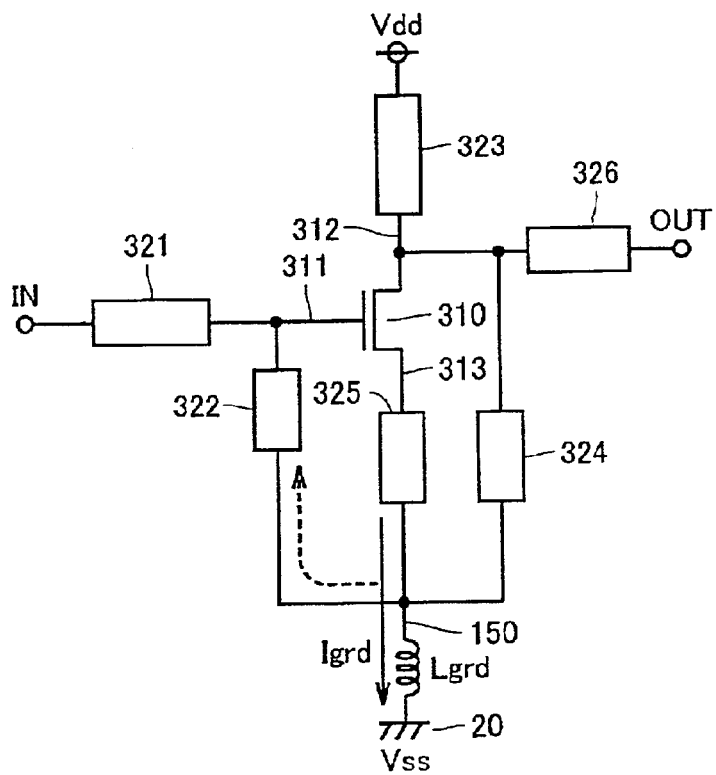
FIG. 22 is a conceptual diagram illustrating the problems that occur in the high-frequency amplifier circuit of FIG. 21 due to the parasitic inductance of the ground lines.
Figure 23:
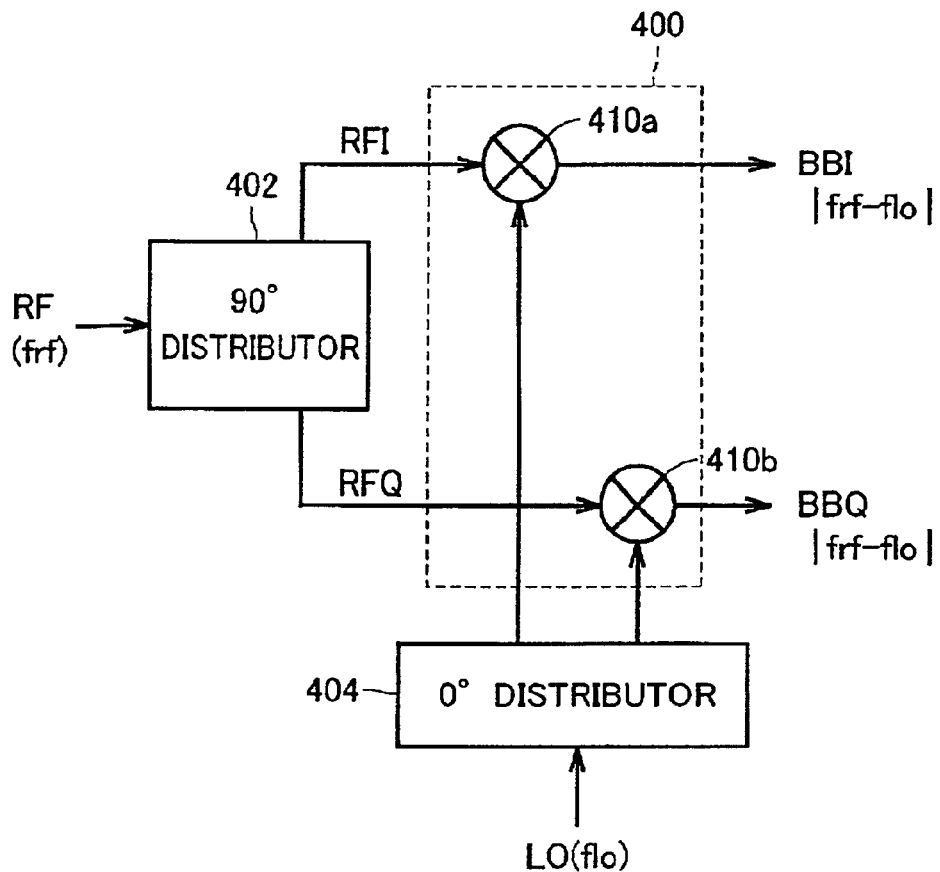
FIG. 23 is a block diagram showing arrangement of the orthogonal mixer.
Figure 24:
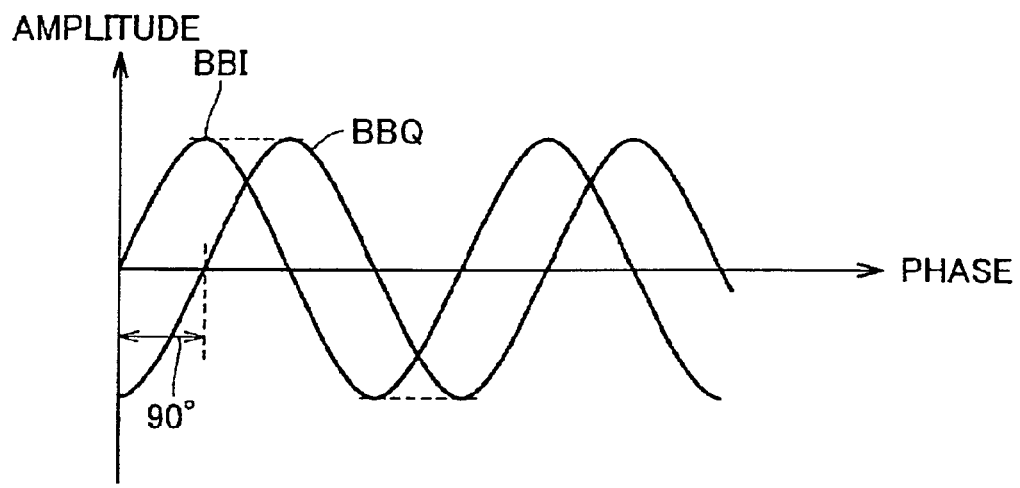
FIG. 24 is a waveform chart illustrating an ideal output signal of the orthogonal mixer.
Figure 25:
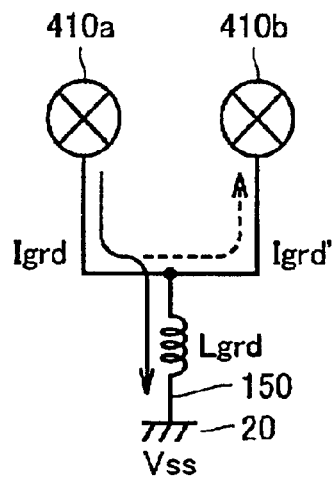
FIG. 25 is a conceptual diagram illustrating the problems that occur in the orthogonal mixer of FIG. 23 due to the parasitic inductance of the ground lines.
Figure 26:
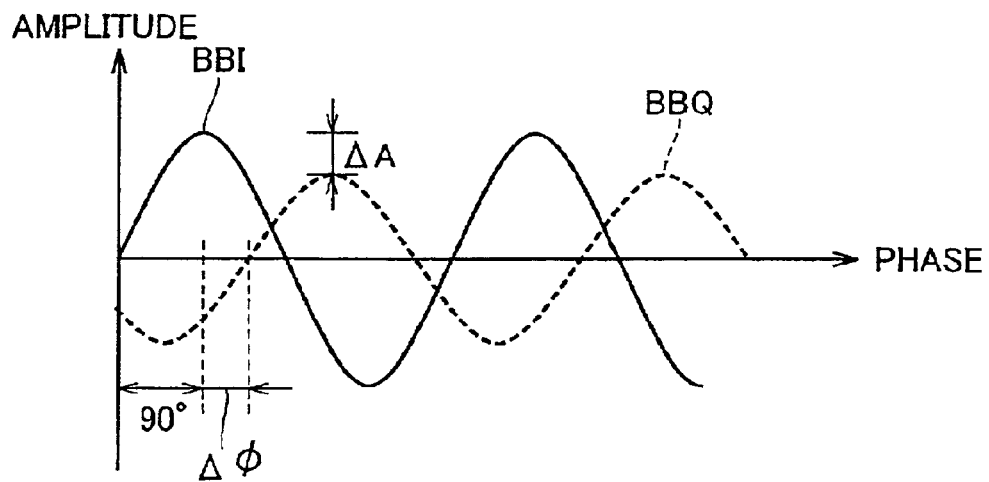
FIG. 26 is a waveform chart illustrating the problems shown in FIG. 25.

Referring to FIG. 14, the circuit structure of, e.g., the high frequency amplifier described in connection with FIG. 21 may be applied to the low noise amplifier 518. The low noise amplifier 518 includes a field effect transistor 310, and blocks 321 to 326 representing a peripheral circuit element group. A high frequency signal RF, i.e., a receiving wave, is applied to the input node IN, and an amplified signal output from the output node OUT is transmitted to the band pass filter 520. Note that, although FIG. 14 shows the structure using the field effect transistor, a bipolar transistor may be used instead of the field effect transistor. In this case, the base, collector and emitter of the bipolar transistor need only be connected instead of the gate, source and drain of the field effect transistor.

The low noise amplifier 518 is grounded by independent ground lines 585g and 585s. The ground line 585s corresponds to the source 313 of the field effect transistor 310. On the other hand, the ground line 585g corresponds to the gate 311 and drain 312 of the field effect transistor 310.

The ground lines 585s and 585g can be electrically coupled to a plurality of independent ground pin terminals, respectively, according to the structure of the ground lines 570a, 570b in FIG. 9. With such a structure, the wiring for grounding the gate 311 and the wiring for grounding the source 311 can be separated from each other in the field effect transistor 310. Accordingly, a source-drain current flowing through the channel of the field effect transistor 310 for signal amplification will not flow into the gate 311, whereby oscillation of the overall operation of the low noise amplifier 18 can be prevented.

Alternatively, a common node Ncmn formed in the lowest insulating layer of the multi-layer substrate module may integrate the ground lines 585g and 585s so that the ground lines are connected to the earth node 20 through a common ground pin terminal, according to the structure of the ground lines 570a, 570b in FIG. 10. In this case as well, the parasitic inductance value of the portion shared by the wiring for grounding the gate 311 and the wiring for grounding the source 312 can be suppressed, enabling stabilized operation of the low noise amplifier 518.

Hereinafter, arrangement of the low noise amplifier in which a plurality of transistors are connected in series with each other for signal amplification will be described.

In this case, for example, two integrated circuits 518a and 518b having the same structure as that of the low noise amplifier 518 in FIG. 14 may be integrated into a single chip in order to form an integrated circuit (low noise amplifier) 590.

Figure 15:
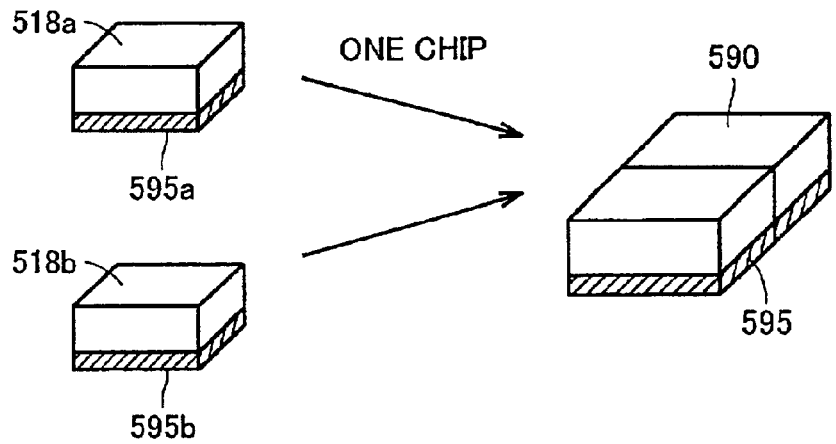
FIG. 15 is a conceptual diagram illustrating integration of two integrated circuits into a single chip.
Figure 20:
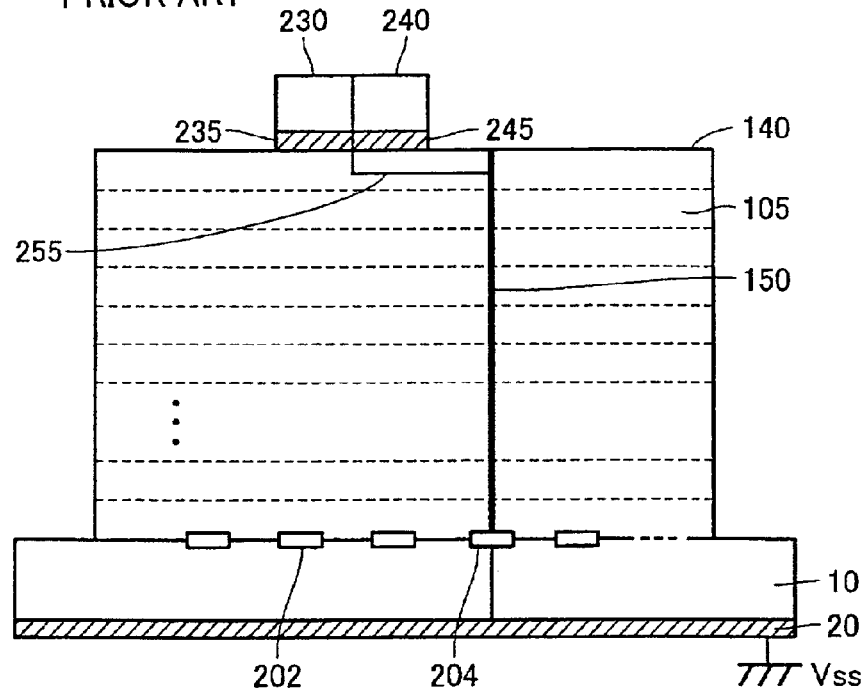
FIG. 20 is a cross-sectional view showing a common arrangement example of a plurality of internal circuits formed on the multi-layer substrate module.

As shown in FIG. 15, the integrated circuit 590 is formed from the integrated circuits 518a and 518b connected to each other. Metal ground electrodes 595a and 595b respectively provided on the back surfaces of the integrated circuits are connected together into a common metal electrode 595. In the case where the low noise amplifier 590 formed from such a one-chip integrated circuit is mounted on the top surface of the multi-layer substrate module 140 according to the method of FIG. 20, a ground line is shared by the field effect transistors in the respective amplifier modules. Therefore, the oscillation phenomenon due to the inflow of the earth current is more likely to occur during high-frequency operation.

Figure 16:
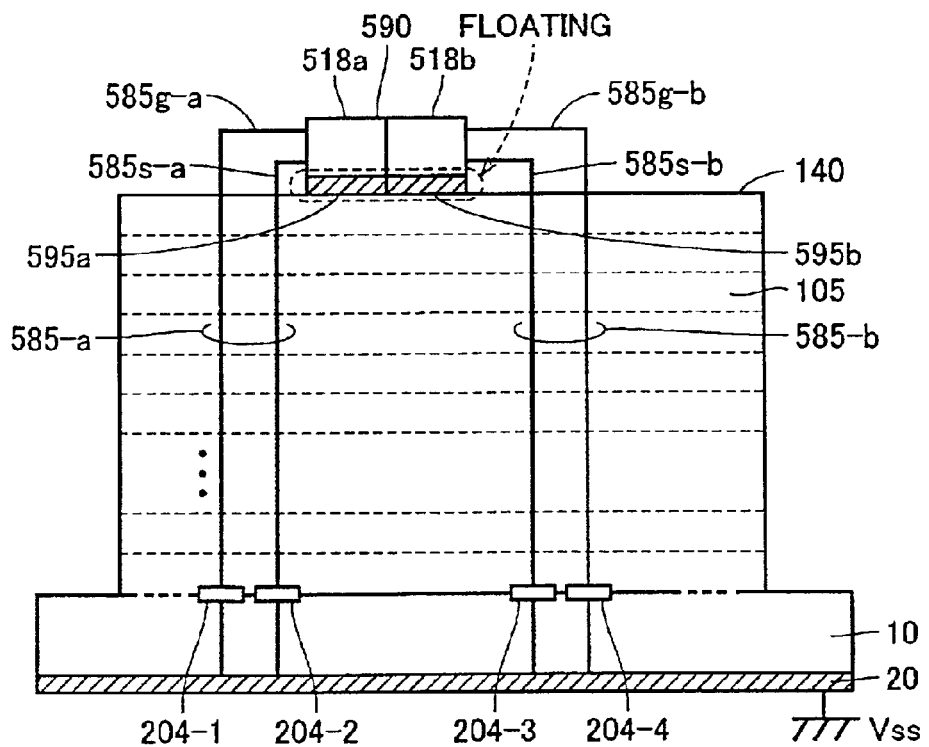
FIG. 16 is a cross-sectional view showing an arrangement example of ground lines for a one-chip low noise amplifier formed on the multi-layer substrate module according to the fourth embodiment of the present invention.

Referring to FIG. 16, the one-chip low noise amplifier 590 is mounted on the top surface of the multi-layer substrate module 140. However, the transistor elements in the integrated circuits 518a and 518b are not connected to back metals 595a, 595b, respectively, and ground lines are provided directly between the integrated circuits and corresponding ground pin terminals.

A ground line 585-a is provided for the integrated circuit 518a. As described in connection with FIG. 14, the ground line 585-a includes a ground line 585g-a corresponding to the gate 311 of the transistor in the low noise amplifier and a ground line 585s-a corresponding to the source 313 thereof. Similarly, a ground line 585-b is provided for the integrated circuit 518b. The ground line 585-b includes ground lines 585g-b and 585s-b. These ground lines are connected to the earth node 20 through independent ground pin terminals 204-1 to 201-4, respectively.

Figure 17:
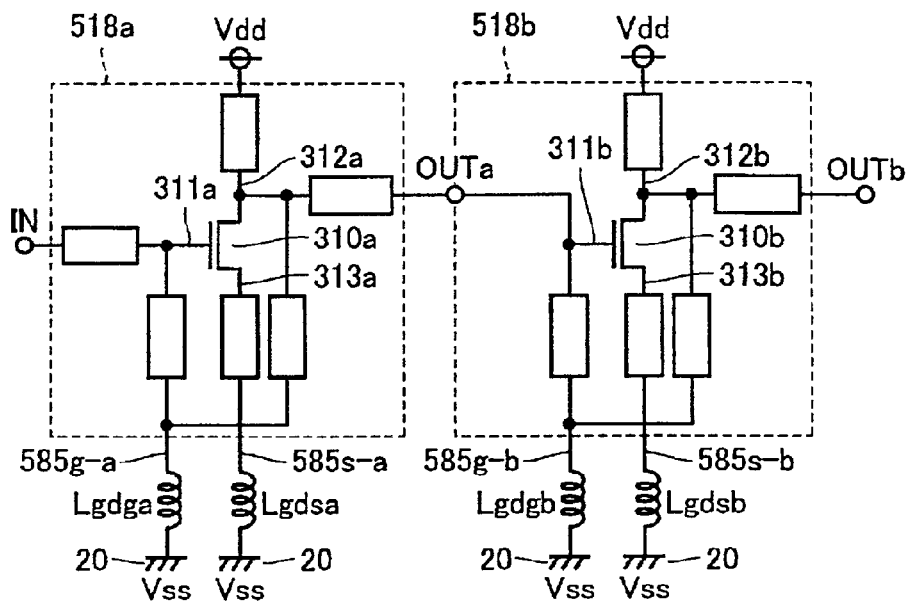
FIG. 17 is a circuit diagram of the one-chip low noise amplifier formed on the multi-layer substrate module according to the fourth embodiment of the present invention.

Referring to FIG. 17, this structure can prevent the oscillation phenomenon caused by the earth current flowing into the gate 311a of a field effect transistor 310a in the integrated circuit 518a. Similarly, the earth current is prevented from flowing from another portion into the gate 311b of the field effect transistor 310b in the integrated circuit 518b, whereby the oscillation phenomenon can be prevented.

Note that, according to the structure as shown in FIG. 13, the ground lines for the integrated circuits 518a and 518b may be electrically coupled to the earth node 20 by a common ground pin terminal through a common node Ncmn provided in the lowest layer of the multi-layer substrate module. In this case as well, parasitic inductance of the portion shared by the ground lines is suppressed, whereby the oscillation phenomenon can be prevented.

Although the structure of FIG. 17 also includes the field effect transistors as amplifying elements, current-driven bipolar transistors may alternatively be used.

Note that FIGS. 15 to 17 illustrate the structure integrating two integrated circuits (low noise amplifier circuits). However, even when three or more integrated circuits are integrated, independent ground lines need only be provided for the respective integrated circuits, as sown in FIG. 16.

It should be understood that the embodiments disclosed herein are by way of illustration and example only in all respects and are not to be taken by way of limitation. The scope of the present invention is defined by the appended claims rather than the foregoing description, and it is intended by the appended claims to cover all modifications that fall within the sense and scope that are equivalent to the appended claims.

Industrial Applicability

The multi-layer substrate module of the present invention is applicable to mounting of the internal circuits of a high frequency portable wireless device such as mobile phone.

What is claimed is:

1. A multi-layer substrate module receiving a supply of a reference potential from an external potential node, comprising:
   a plurality of insulating layers laminated to each other;
   a plurality of reference potential transmission nodes electrically coupled to said external potential node;
   a plurality of internal circuits each including at least one circuit element formed either in one of the plurality of insulating layers or on a surface of said multi-layer substrate module;
   a plurality of reference potential lines provided corresponding to said plurality of internal circuits, such that one of said plurality of reference potential lines is provided to connect one of said plurality of internal circuits to a corresponding one of said reference potential nodes for transmitting said reference potential; and
   a plurality of via holes extending through at least a part of said plurality of insulating layers, the plurality of via holes being provided between said plurality of internal circuits and the plurality of reference potential transmission nodes, wherein
   said plurality of reference potential lines are formed in said plurality of via holes, and
   one of said plurality of via holes in which one of said plurality of reference potential lines is formed has a larger cross-sectional area than that of each of a remainder of said plurality of via holes.

2. The multi-layer substrate module according to claim 1, wherein
   one of said plurality of reference potential lines has a smaller parasitic inductance than that of each of a remainder of said plurality of reference potential lines.

* * * * *